US012787559B2

(12) United States Patent
Xiang et al.

(10) Patent No.: US 12,787,559 B2
(45) Date of Patent: Nov. 3, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Zhiwei Xiang, Beijing (CN); Mengmeng Du, Beijing (CN); Cong Fan, Beijing (CN); Qiwei Wang, Beijing (CN); Wenzhe Cai, Beijing (CN); Xiangdan Dong, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 358 days.

(21) Appl. No.: 18/704,045

(22) PCT Filed: Apr. 14, 2023

(86) PCT No.: PCT/CN2023/088386
§ 371 (c)(1),
(2) Date: Apr. 23, 2024

(87) PCT Pub. No.: WO2024/212218
PCT Pub. Date: Oct. 17, 2024

(65) Prior Publication Data

US 2026/0157040 A1 Jun. 4, 2026

(51) Int. Cl.
*H10K 59/122* (2023.01)
*H10K 59/121* (2023.01)
(Continued)

(52) U.S. Cl.
CPC ....... *H10K 59/122* (2023.02); *H10K 59/1213* (2023.02); *H10K 59/131* (2023.02); *H10K 2102/351* (2023.02)

(58) Field of Classification Search
CPC ......... H10K 59/8722; H10K 2102/311; H10K 59/8051; H10K 59/80518; H10K 77/111;
(Continued)

(56) References Cited

U.S. PATENT DOCUMENTS 11,991,905 B2 * 5/2024 Long .......................... G02F 1/13
2020/0185647 A1 * 6/2020 Lee ...................... G09G 3/3266
(Continued)

*Primary Examiner* — Mark W Tornow
*Assistant Examiner* — Priya M Rampersaud
(74) *Attorney, Agent, or Firm* — IPro, PLLC

(57) ABSTRACT

Provided are a display panel and a display apparatus. The display panel includes a base substrate, the base substrate includes a display region and a non-display region surrounding the display region, and the non-display region includes a first bezel region and a second bezel region having a binding region; blocking dams located in the non-display region and arranged surrounding the display region, the blocking dams include a first blocking dam and a second blocking dam, and the first blocking dam is located between the second blocking dam and the display region; and a first flat layer, a second flat layer and a third flat layer located on the base substrate; the second blocking dam includes the first flat layer and the third flat layer in the first bezel region, and the second blocking dam includes the second flat layer and the third flat layer in the second bezel region.

20 Claims, 6 Drawing Sheets

(51) Int. Cl.
*H10K 59/131* (2023.01)
*H10K 102/00* (2023.01)

(58) Field of Classification Search
CPC ......... H10K 2102/351; H10K 59/1213; H10K 59/122; H10K 59/131; H05K 2201/10128; H05K 1/189; H05K 1/147
See application file for complete search history.

(56) References Cited

U.S. PATENT DOCUMENTS

2020/0274094 A1* 8/2020 Zheng .................... H10K 59/80
2022/0020955 A1* 1/2022 Lee ...................... H10K 59/122
2022/0020958 A1* 1/2022 Okabe ....................... G09F 9/00

* cited by examiner

DISPLAY PANEL AND DISPLAY APPARATUS

CROSS REFERENCE TO RELATED APPLICATIONS

The present disclosure is a US National Stage of International Application No. PCT/CN2023/088386, filed on Apr. 14, 2023, the entire contents of which are incorporated herein by reference.

TECHNICAL FIELD

The present disclosure relates to the technical field of display, in particular to a display panel and a display apparatus.

BACKGROUND

Organic light-emitting diodes (OLEDs) have the advantages of being self-luminous, quick in response, wide in viewing angle, high in brightness, colorful, thin and the like, thus being widely applied.

With the extreme pursuit of consumers for display products, at present, the design requirements for OLED display panels are higher and higher. In order to increase a screen-to-body ratio and improve visual enjoyment, the design of a narrow bezel is indispensable.

SUMMARY

The present disclosure provides a display panel and a display apparatus, and a specific solution is as follows.

An embodiment of the present disclosure provides a display panel, including:

- a base substrate, including a display region and a non-display region surrounding the display region, the non-display region including a first bezel region and a second bezel region having a binding region;
- blocking dams located in the non-display region and arranged surrounding the display region, the blocking dams including a first blocking dam and a second blocking dam, and the first blocking dam being located between the second blocking dam and the display region; and
- a first flat layer, a second flat layer and a third flat layer located on the base substrate; wherein
- the second blocking dam includes the first flat layer and the third flat layer in the first bezel region, and the second blocking dam includes the second flat layer and the third flat layer in the second bezel region.

Optionally, in the embodiment of the present disclosure, an overall thickness of the second blocking dam in the first bezel region and the second bezel region is approximately uniform.

Optionally, in the embodiment of the present disclosure, the display panel further includes a pixel defining layer and a spacer, wherein the first flat layer, the second flat layer, the third flat layer, the pixel defining layer and the spacer are sequentially arranged facing away from the base substrate, the second blocking dam further includes the pixel defining layer and the spacer in the first bezel region, and the second blocking dam further includes the pixel defining layer in the second bezel region.

Optionally, in the embodiment of the present disclosure, the display panel further includes a first source-drain layer located between the first flat layer and the base substrate, a second source-drain layer located between the first flat layer and the second flat layer, and a third source-drain layer located between the second flat layer and the third flat layer, wherein the first source-drain layer, the second source-drain layer and the third source-drain layer at least partially overlap the second blocking dam.

Optionally, in the embodiment of the present disclosure, in the first bezel region, the display panel includes a plurality of panel crack detection lines and a low-potential trace; wherein the low-potential trace includes a first structure, a second structure and a third structure sequentially arranged facing away from the base substrate in a stacked mode, the first structure and the panel crack detection lines are arranged at the same layer as the first source-drain layer, the second structure is arranged at the same layer as the second source-drain layer, and the third structure is arranged at the same layer as the third source-drain layer. Optionally, in the embodiment of the present disclosure, an orthographic projection of at least one of the plurality of panel crack detection lines on the base substrate completely falls into a region range of an orthographic projection of the second blocking dam on the base substrate, and the at least one panel crack detection line is completely coated with the first flat layer; and in a region corresponding to the second blocking dam of the first bezel region, the first structure, the second structure and the third structure all partially overlap the first flat layer.

Optionally, in the embodiment of the present disclosure, in the second bezel region, the display panel includes a high-potential trace and a low-potential trace; wherein the high-potential trace includes a fourth structure, a fifth structure and a sixth structure sequentially arranged facing away from the base substrate in a stacked mode, the sixth structure is arranged at the same layer as the third source-drain layer, the fifth structure is arranged at the same layer as the second source-drain layer, and the fourth structure is arranged at the same layer as the first source-drain layer.

Optionally, in the embodiment of the present disclosure, the sixth structure completely penetrates through the second blocking dam, and in a region corresponding to the second blocking dam of the second bezel region, the fourth structure and the fifth structure partially overlap, and the second flat layer completely coats an overlapping part of the fourth structure and the fifth structure.

Optionally, in the embodiment of the present disclosure, the second blocking dam further includes an adapting portion extending from the first bezel region to the second bezel region, and surfaces of the sides, facing away from the base substrate, of the first flat layer included in the adapting portion and the second flat layer included in the second blocking dam in the second bezel region are arranged in an approximately flush mode.

Optionally, in the embodiment of the present disclosure, in the first bezel region, the first blocking dam includes the third flat layer, the pixel defining layer and the spacer, and in a region corresponding to the first blocking dam, the low-potential trace is located between the first blocking dam and the base substrate.

Optionally, in the embodiment of the present disclosure, the display panel further includes an anode layer located between the pixel defining layer and the third flat layer, and in the first bezel region, the anode layer is electrically connected with the low-potential trace, and the low-potential trace is electrically connected with a cathode layer through a portion of the anode layer located in the first bezel region.

Optionally, in the embodiment of the present disclosure, in the second bezel region, the first blocking dam includes a first sub-dam and a second sub-dam sequentially arranged at intervals, the first sub-dam is located between the second sub-dam and the second blocking dam, the first sub-dam includes the third flat layer, the pixel defining layer and the spacer, the second sub-dam includes the third flat layer and the pixel defining layer, and a thickness of the first sub-dam is greater than a thickness of the second sub-dam.

Optionally, in the embodiment of the present disclosure, in the second bezel region and regions corresponding to the first sub-dam and the second sub-dam, the high-potential trace is located between the first sub-dam and the base substrate, as well as between the second sub-dam and the base substrate. Correspondingly, an embodiment of the present disclosure provides a display apparatus, including: the display panel according to any one of the above.

DETAILED DESCRIPTION

Figure 1:
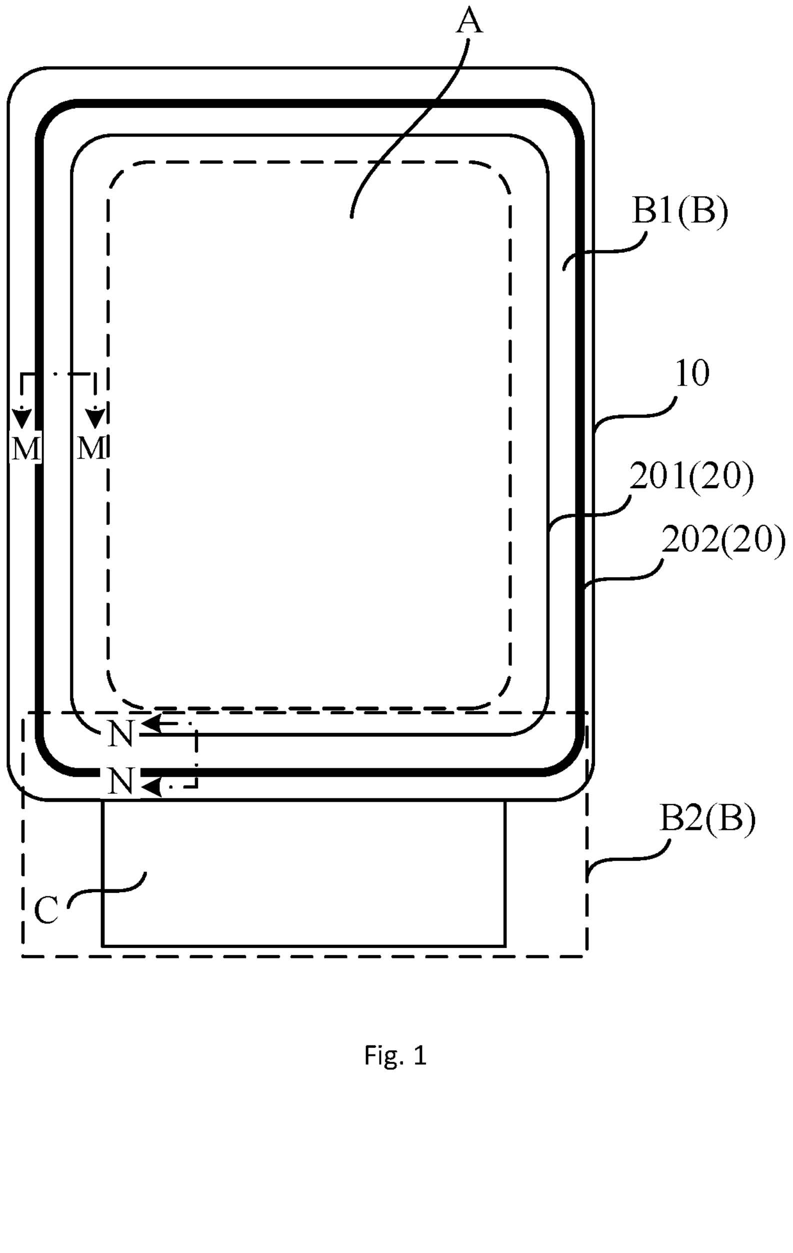
FIG. 1 is one schematic top view of a display panel provided by an embodiment of the present disclosure.

To make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "comprise" or "include" or the like used in the present disclosure indicate that an element or item appearing before such word covers listed elements or items appearing after the word and equivalents thereof, and does not exclude other elements or items.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions throughout.

In a narrow bezel design of an OLED display product, in order to lower resistance-capacitance (RC) loading, a design of three layers of metal traces is often adopted. In this way, in a design of a packaging dam, a design of three organic layers is involved. In the designing process, not only does the effect of blocking overflow of ink jet printing (IJP) materials of the packaging dam need to be considered, but also a touch control effect of touch screen panel (TSP) traces above the packaging dam needs to be considered. If an organic layer at the packaging dam is too thick, it will lead to the unevenness of the TSP traces, thus affecting touch control. If an organic layer at the dam is too thin, it cannot block the IJP materials, thus affecting the packaging effect.

In view of this, embodiments of the present disclosure provide a display panel and a display apparatus, used for considering the packaging effect and the touch control effect while guaranteeing the narrow bezel design.

Figure 2:
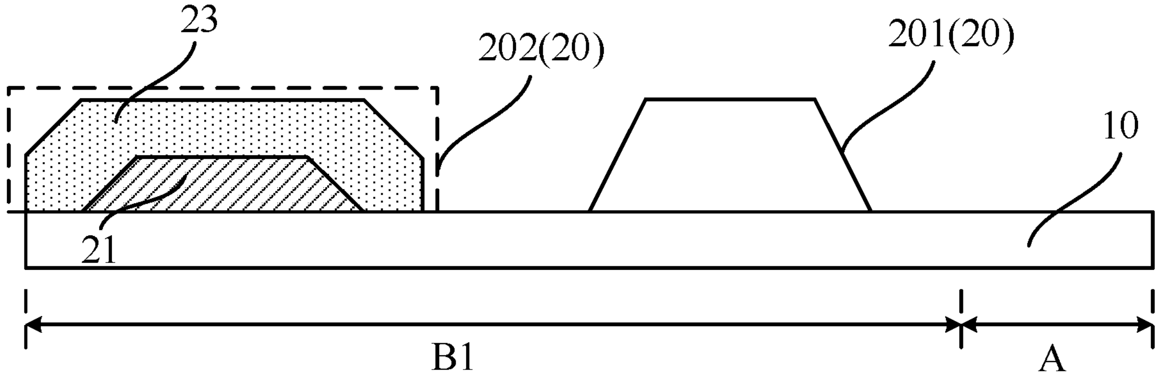
FIG. 2 is one schematic sectional view in a direction MM in FIG. 1.
Figure 3:
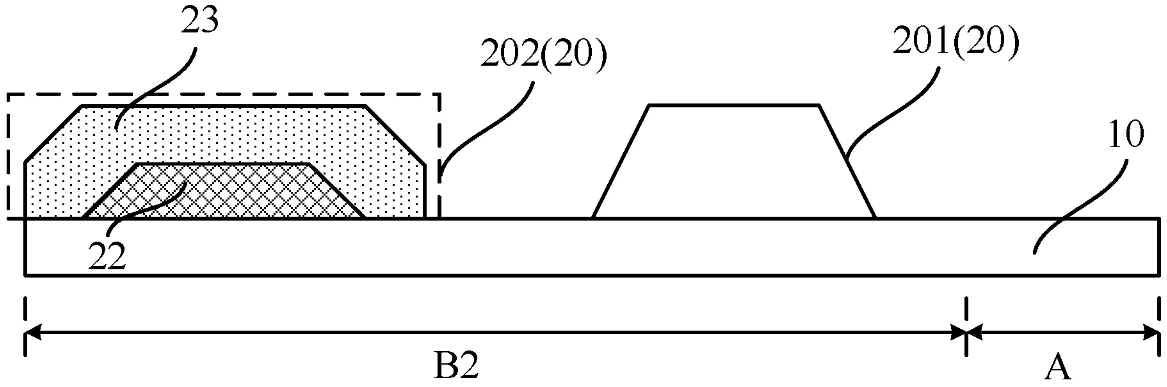
FIG. 3 is one schematic sectional view in a direction NN in FIG. 1.

In combination with FIG. 1 to FIG. 3, FIG. 1 is one schematic top view of a display panel provided by an embodiment of the present disclosure, FIG. 2 is one schematic sectional view in a direction MM in FIG. 1, and FIG. 3 is one schematic sectional view in a direction NN in FIG. 1. Specifically speaking, the display panel includes:

- a base substrate 10, including a display region A and a non-display region B surrounding the display region A, the non-display region B including a first bezel region B1 and a second bezel region B2 having a binding region C;
- blocking dams 20 located in the non-display region B and arranged surrounding the display region A, the blocking dams 20 including a first blocking dam 201 and a second blocking dam 202, and the first blocking dam 201 being located between the second blocking dam 202 and the display region A; and
- a first flat layer 21, a second flat layer 22 and a third flat layer 23 located on the base substrate 10; wherein
- the second blocking dam 202 includes the first flat layer 21 and the third flat layer 23 in the first bezel region B1, and the second blocking dam 202 includes the second flat layer 22 and the third flat layer 23 in the second bezel region B2.

During specific implementation, the base substrate 10 included in the display panel may be a rigid substrate or a flexible substrate, which is not limited here. When the base substrate 10 is a flexible substrate, a material of the flexible substrate may be a polyimide (PI) thin film, or polyethylene terephthalate (PET) or the like, which is not limited here. The flexible substrate may be of a structure including a single flexible base layer, or a structure including a plurality of flexible base layers, for example, a structure of two flexible base layers, for another example, a structure of three flexible base layers, which is not limited here. In addition, a barrier may be arranged between two adjacent flexible base layers.

Moreover, the base substrate 10 includes the display region A and the non-display region B surrounding the display region A, and the non-display region B includes the first bezel region B1 and the second bezel region B2 having the binding region C. Exemplarily, as for the same display panel, the first bezel region B1 may be a bezel region located on the left side of the display panel, or a bezel region located on the right side of the display panel, or a bezel region located on the upper side of the display panel; and the second bezel region B2 may be a bezel region located on the lower side of the display panel. Exemplarily, a distribution condition of the display region A, the non-display region B, the binding region C, the first bezel region B1 and the second bezel region B2 is as shown in FIG. 1. Of course, the distribution condition of the display region A, the non-display region B, the binding region C, the first bezel region B1 and the second bezel region B2 may further be set according to actual application demands, which is not limited here.

In addition, the display panel further includes the blocking dams 20 located in the non-display region B and arranged surrounding the display region A, and the blocking dams 20 include the first blocking dam 201 and the second blocking dam 202, wherein the first blocking dam 201 is located between the second blocking dam 202 and the display region A. As such, the preparation effect of a subsequent thin film packaging layer can be effectively improved through the first blocking dam 201 and the second blocking dam 202.

Moreover, the display panel further includes the first flat layer 21, the second flat layer 22 and the third flat layer 23 located on the base substrate 10. The second blocking dam 202 includes the first flat layer 21 and the third flat layer 23 in the first bezel region B1, and the second blocking dam 202 includes the second flat layer 22 and the third flat layer 23 in the second bezel region B2. Still in combination with FIG. 2 and FIG. 3, FIG. 2 is one schematic structural diagram of the second blocking dam 202 in the first bezel region B1, and FIG. 3 is one schematic structural diagram of the second blocking dam 202 in the second bezel region B2. On the one hand, the thicknesses of the second blocking dam 202 in the first bezel region B1 and the second bezel region B2 are not too thin, organic packaging materials in a subsequent preparation process of a thin film packaging layer can be effectively blocked, and the packaging effect is guaranteed. On the other hand, during actual preparation, by making an overall thickness of the first flat layer 21 and the third flat layer 23 substantially equal to an overall thickness of the second flat layer 22 and the third flat layer 23, it can be guaranteed that the thicknesses of the second blocking dam 202 in the first bezel region B1 and the second bezel region B2 are substantially equal, thereby guaranteeing the thickness uniformity of the second blocking dam 202 in the whole bezel region. In this way, the influence on a touch control function of TSP traces arranged subsequently is avoided, and thus use performance of the display panel is improved.

It should be noted that, for a specific arrangement condition of the first flat layer 21, the second flat layer 22 and the third flat layer 23, as well as a specific arrangement condition of the first blocking dam 201 and the second blocking dam 202, reference may be made to the description of relevant parts below, which is not described in detail here.

In the embodiment of the present disclosure, an overall thickness of the second blocking dam 202 in the first bezel region B1 and the second bezel region B2 is approximately uniform. Exemplarily, a difference between the thickness of the second blocking dam 202 in the first bezel region B1 and the thickness of the second blocking dam 202 in the second bezel region B2 is in a range of 1.5 μm to 2.5 μm, for example, 2.1 μm. Of course, during actual preparation, a specific difference between the thicknesses of the second blocking dam 202 in different regions may further be set according to actual process errors, which is not limited here. In such way, the thickness uniformity of the second blocking dam 202 in the whole bezel region is effectively guaranteed, and the subsequent touch control effect of the display panel may be guaranteed while the packaging effect is considered.

Figure 4:
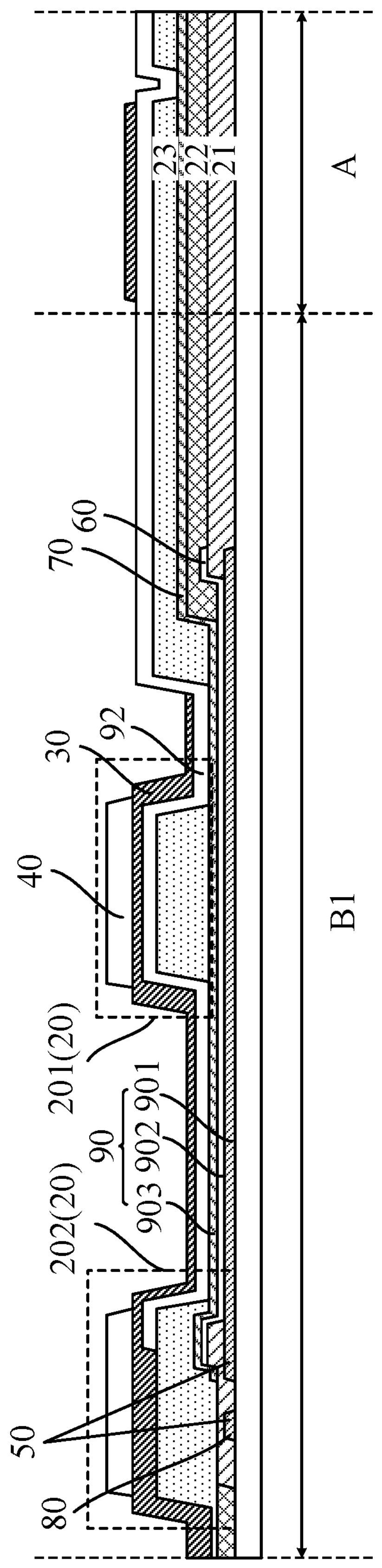
FIG. 4 is another schematic sectional view in a direction MM in FIG. 1.
Figure 5:
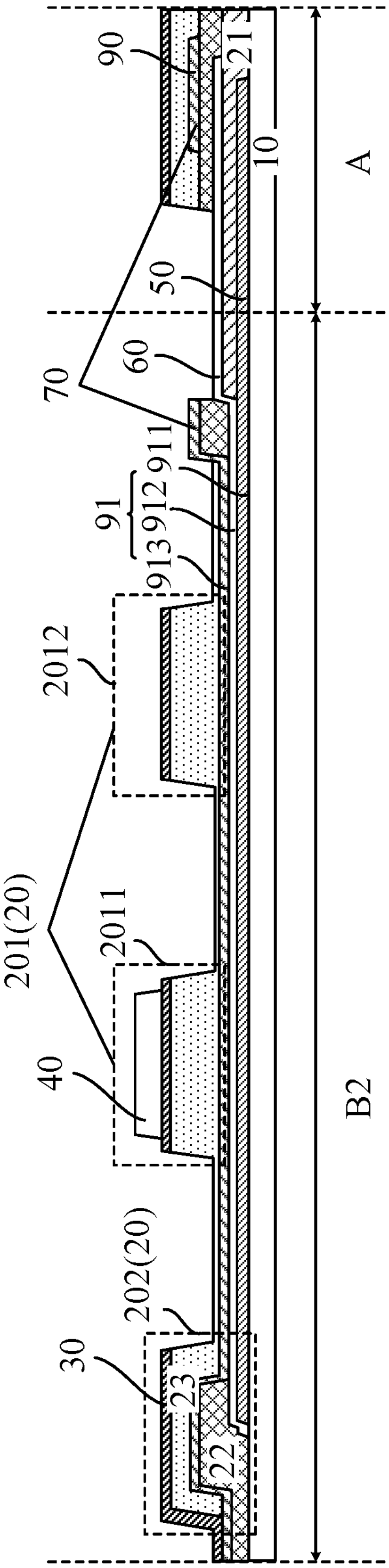
FIG. 5 is another schematic sectional view in a direction NN in FIG. 1.

In the embodiment of the present disclosure, in combination with FIG. 4 and FIG. 5, FIG. 4 is one schematic sectional view in a direction MM in FIG. 1, and FIG. 5 is one schematic sectional view in a direction NN in FIG. 1. Specifically speaking, the display panel further includes a pixel defining layer 30 and spacers 40, the first flat layer 21, the second flat layer 22, the third flat layer 23, the pixel defining layer 30 and the spacers 40 are sequentially arranged facing away from the base substrate 10, the second blocking dam 202 further includes the pixel defining layer 30 and the spacers 40 in the first bezel region B1, and the second blocking dam 202 further includes the pixel defining layer 30 in the second bezel region B2.

Still in combination with the exemplary embodiment shown in FIG. 4, the second blocking dam 202 includes, in the first bezel region B1, the first flat layer 21, the third flat layer 23, the pixel defining layer 30 and the spacers 40 sequentially arranged facing away from the base substrate 10. Still in combination with the exemplary embodiment shown in FIG. 5, the second blocking dam 202 includes, in the second bezel region B2, the second flat layer 22, the third flat layer 23 and the pixel defining layer 30 sequentially arranged facing away from the base substrate 10. In this way, whether in the first bezel region B1 or the second bezel region B2, the second blocking dam 202 may be made relatively thicker, which is conducive to effective blocking of the organic packaging materials in a subsequent thin film packaging layer, and guarantees the packaging effect of the display panel.

In the embodiment of the present disclosure, the display panel further includes a first source-drain layer 50 located between the first flat layer 21 and the base substrate 10, a second source-drain layer 60 located between the first flat layer 21 and the second flat layer 22, and a third source-drain layer 70 located between the second flat layer 22 and the third flat layer 23, wherein the first source-drain layer 50, the second source-drain layer 60 and the third source-drain layer 70 at least partially overlap the second blocking dam 202.

Still in combination with FIG. 4 and FIG. 5, the display panel further includes the first source-drain layer 50 located between the first flat layer 21 and the base substrate 10, the second source-drain layer 60 located between the first flat layer 21 and the second flat layer 22, and the third source-drain layer 70 located between the second flat layer 22 and the third flat layer 23. In this way, by arranging the first source-drain layer 50, the second source-drain layer 60 and the third source-drain layer 70, the resistance-capacitance loading is lowered, and the display effect is guaranteed. Exemplarily, the first source-drain layer 50, the second source-drain layer 60 and the third source-drain layer 70 are made of the same material, which is a titanium/aluminum/titanium (Ti/Al/Ti) composite material. Of course, specific materials of the first source-drain layer 50, the second source-drain layer 60 and the third source-drain layer 70 may further be arranged according to actual application demands, which are not limited here. Moreover, the first source-drain layer 50, the second source-drain layer 60 and the third source-drain layer 70 at least partially overlap the second blocking dam 202.

In the embodiment of the present disclosure, still in combination with FIG. 4, in the first bezel region B1, the display panel includes a plurality of panel crack detection lines 80 and a low-potential trace 90. The low-potential trace 90 includes a first structure 901, a second structure 902 and a third structure 903 sequentially arranged facing away from the base substrate 10 in a stacked mode, the first structure 901 and the panel crack detection lines 80 are arranged at the same layer as the first source-drain layer 50, the second structure 902 is arranged at the same layer as the second source-drain layer 60, and the third structure 903 is arranged at the same layer as the third source-drain layer 70.

Still in combination with the exemplary embodiment shown in FIG. 4, in the first bezel region B1, the display panel includes the plurality of panel crack detection (PCD) lines 80 and the low-potential (VSS) trace 90. The plurality of panel crack detection lines 80 are configured to transmit a panel crack detection signal, and the low-potential trace 90 is configured to transmit a VSS signal. The plurality of panel crack detection lines 80 may perform panel crack detection on the periphery of the display panel, which guarantees the use performance of the display panel. Of course, the specific quantity of the plurality of panel crack detection lines 80 may be set according to actual application demands, which is not limited here. Moreover, the low-potential trace 90 includes the first structure 901, the second structure 902 and the third structure 903 sequentially arranged facing away from the base substrate 10 in the stacked mode. During actual preparation, the first structure 901 and the panel crack detection lines 80 are arranged at the same layer as the first source-drain layer 50, the second structure 902 is arranged at the same layer as the second source-drain layer 60, and the third structure 903 is arranged at the same layer as the third source-drain layer 70. In this way, a manufacturing process of the display panel is simplified, and the manufacturing efficiency of the display panel is improved. In the embodiment of the present disclosure, an orthographic projection of at least one of the plurality of panel crack detection lines 80 on the base substrate 10 completely falls into a region range of an orthographic projection of the second blocking dam 202 on the base substrate 10, and the at least one panel crack detection line 80 is completely coated with the first flat layer 21; and in a region corresponding to the second blocking dam 202 of the first bezel region B1, the first structure 901, the second structure 902 and the third structure 903 all partially overlap the first flat layer 21.

During specific implementation, the orthographic projection of the at least one of the plurality of panel crack detection lines 80 on the base substrate 10 completely falls into the region range of the orthographic projection of the second blocking dam 202 on the base substrate 10, and the at least one panel crack detection line 80 is completely coated with the first flat layer 21. In this way, the corresponding panel crack detection line 80 is completely coated with the first flat layer 21, thereby effectively protecting the corresponding panel crack detection line 80. The quantity of the at least one panel crack detection line 80 may be one or more, and the specific quantity of the at least one panel crack detection line 80 may be set according to actual application demands, which is not limited here. In the exemplary embodiment as shown in FIG. 4, one panel crack detection line 80 is completely coated with the first flat layer 21.

Moreover, in the region corresponding to the second blocking dam 202 of the first bezel region B1, the first structure 901, the second structure 902 and the third structure 903 all partially overlap the first flat layer 21. The first structure 901, the second structure 902 and the third structure 903 all extend in a direction from the first bezel region B1 pointing to the display region A, and orthographic projections of the first structure 901 and the second structure 902 on the base substrate 10 completely fall into a region range of an orthographic projection of the third structure 903 on the base substrate 10. It should be noted that, in the region corresponding to the second blocking dam 202 of the first bezel region B1, an end of the second structure 902 facing away from the display region A is completely coated with an end of the third structure 903 facing away from the display region A, and the third flat layer 203 completely coats an overlapping part of the second structure 902 and the third structure 903, thereby effectively protecting the ends of the second structure 902 and the third structure 903, and improving the use performance of the display panel.

In the embodiment of the present disclosure, still in combination with FIG. 5, in the second bezel region B2, the display panel includes a high-potential trace 91 and a low-potential trace 90. The high-potential trace 91 includes a fourth structure 911, a fifth structure 912 and a sixth structure 913 sequentially arranged facing away from the base substrate 10 in a stacked mode, the sixth structure 913 and the low-potential trace 90 are arranged at the same layer as the third source-drain layer 70, the fifth structure 912 is arranged at the same layer as the second source-drain layer 60, and the fourth structure 911 is arranged at the same layer as the first source-drain layer 50.

Still in combination with the exemplary embodiment shown in FIG. 5, in the second bezel region B2, the display panel includes the high-potential (VDD) trace 91 and the low-potential (VSS) trace 90, and correspondingly, the high-potential trace 91 and the low-potential trace 90 are arranged discontinuously. The high-potential trace 91 is configured to transmit a VDD signal, and the low-potential trace 90 is configured to transmit a VSS signal, thereby guaranteeing the driving capability of the display panel. Moreover, the high-potential trace 91 includes the fourth structure 911, the fifth structure 912 and the sixth structure 913 sequentially arranged facing away from the base substrate 10 in the stacked mode. During actual preparation, the sixth structure 913 is arranged at the same layer as the third source-drain layer 70, the fifth structure 912 is arranged at the same layer as the second source-drain layer 60, and the fourth structure 911 is arranged at the same layer as the first source-drain layer 50. In this way, a manufacturing process of the display panel is simplified, and the manufacturing efficiency of the display panel is improved.

In the embodiment of the present disclosure, still in combination with FIG. 5, the sixth structure 913 completely penetrates through the second blocking dam 202, and in a region corresponding to the second blocking dam 202 of the second bezel region B2, the fourth structure 911 and the fifth structure 912 partially overlap, and the second flat layer 22 completely coats an overlapping part of the fourth structure 911 and the fifth structure 912.

Still in combination with the exemplary embodiment shown in FIG. 5, the sixth structure 913 in the high-potential trace 91 completely penetrates through the second blocking dam 202. In the region corresponding to the second blocking dam 202 of the second bezel region B2, the fourth structure 911 and the fifth structure 912 partially overlap. The second flat layer 22 completely coats the overlapping part of the fourth structure 911 and the fifth structure 912, and the second flat layer 22 extends in a direction facing away from the display region A. In this way, through the second flat layer 22, an end of the overlapping part of the fourth structure 911 and the fifth structure 912 facing away from the display region A may be effectively protected, and the use performance of the display panel is improved. It should be noted that, the fourth structure 911, the fifth structure 912 and the sixth structure 913 all extend in a direction from the second bezel region B2 pointing to the display region A.

Figure 6:
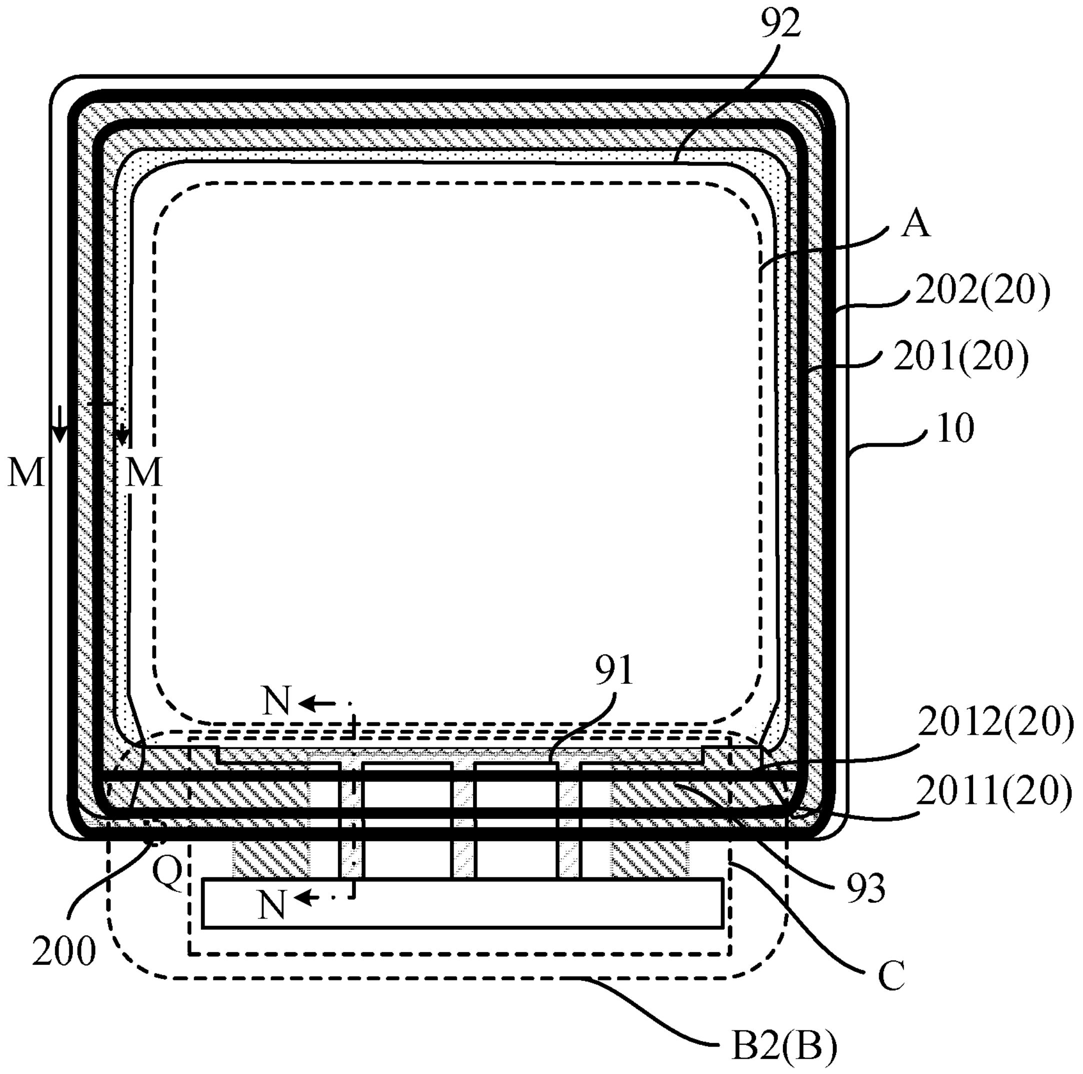
FIG. 6 is another schematic top view of a display panel provided by an embodiment of the present disclosure.
Figure 7:
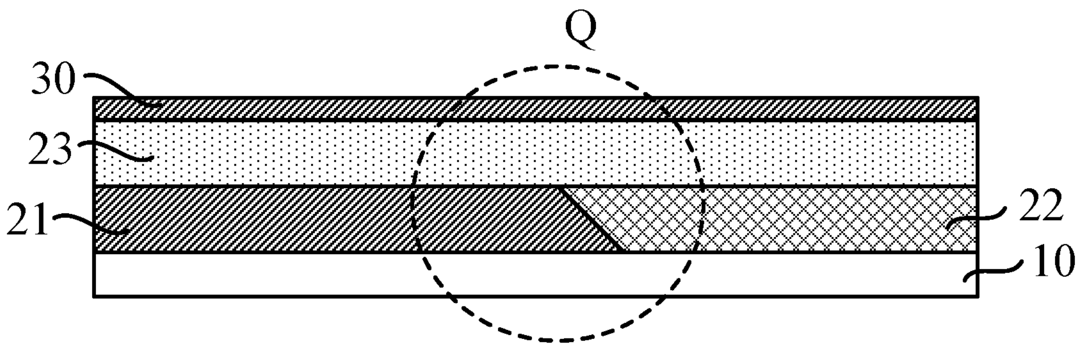
FIG. 7 is a schematic partial sectional view of a second blocking dam corresponding to a region Q in FIG. 6.

In the embodiment of the present disclosure, in combination with FIG. 6 and FIG. 7, FIG. 6 is one schematic top view of the display panel, and FIG. 7 is a schematic partial sectional view of the second blocking dam 202 corresponding to a region Q in FIG. 6. Specifically speaking, the second blocking dam 202 further includes an adapting portion 200 extending from the first bezel region B1 to the second bezel region B2, and surfaces of the sides, facing away from the base substrate 10, of the first flat layer 21 included in the adapting portion 200 and the second flat layer 22 included in the second blocking dam 202 in the second bezel region B2 are arranged in an approximately flush mode.

Still in combination with FIG. 6 and FIG. 7, the second blocking dam 202 further includes the adapting portion 200 extending from the first bezel region B1 to the second bezel region B2, and the surfaces of the sides, facing away from the base substrate 10, of the first flat layer 21 included in the adapting portion 200 and the second flat layer 22 included in the second blocking dam 202 in the second bezel region B2 are arranged in the approximately flush mode. Exemplarily, an error between the two surfaces is in a range of 1.5 μm to 2.5 μm, for example, 2.1 μm. In this way, the thickness uniformity of the second blocking dam 202 is guaranteed while a differentiation design of the second blocking dam 202 in the first bezel region B1 and the second bezel region B2 is achieved. It should be noted that, FIG. 7 only takes a small portion of the structure for simple illustration, and for the detailed structure of the second blocking dam 202, please specifically refer to the description in the relevant sections mentioned earlier, which is omitted here. In addition, during actual preparation of the first flat layer 21, since a region corresponding to the adapting portion 200 in the first flat layer 21 has a certain angle of gradient due to an etching process, the angle of gradient enables only a small part of the second flat layer 22 to remain above the first flat layer 21 in a subsequent process of preparing the second flat layer 22, and the flatness of a surface of a side of the first flat layer 21 facing away from the base substrate 10 is barely affected. In this way, at the adapting position, the surfaces of the sides, facing away from the base substrate 10, of the first flat layer 21 included in the adapting portion 200 and the second flat layer 22 included in the second blocking dam 202 in the second bezel region B2 are arranged in a basically flush mode, thereby guaranteeing the packaging effect of the display panel.

In the embodiment of the present disclosure, in the first bezel region B1, the first blocking dam 201 includes the third flat layer 23, the pixel defining layer 30 and the spacers 40, and in a region corresponding to the first blocking dam 201, the low-potential trace 90 is located between the first blocking dam 201 and the base substrate 10.

Still in combination with the exemplary embodiment shown in FIG. 4 and FIG. 5, in the first bezel region B1, the first blocking dam 201 includes the third flat layer 23, the pixel defining layer 30 and the spacers 40. During actual preparation, same film layers of the first blocking dam 201 and the second blocking dam 202 may be manufactured as the same layers, so that a manufacturing process of the display panel is simplified while the use performance of the display panel is guaranteed. Moreover, in the region corresponding to the first blocking dam 201, the low-potential trace 90 is located between the first blocking dam 201 and the base substrate 10, and correspondingly, the first structure 901, the second structure 902 and the third structure 903 included in the low-potential trace 90 are located between the first blocking dam 201 and the base substrate 10. In this way, power consumption of the display panel is lowered while the RC loading is lowered.

In the embodiment of the present disclosure, the display panel further includes an anode layer 92 located between the pixel defining layer 30 and the third flat layer 23, and in the first bezel region B1, the anode layer 92 is electrically connected with the low-potential trace 90, and the low-potential trace 90 is electrically connected with a cathode layer through a portion of the anode layer 92 located in the first bezel region B1.

Still in combination with FIG. 4 and FIG. 6, the display panel further includes the anode layer 92 located between the pixel defining layer 30 and the third flat layer 23. In the first bezel region B1, the anode layer 92 is electrically connected with the low-potential trace 90. Moreover, the low-potential trace 90 is electrically connected with the cathode layer through the portion of the anode layer 92 located in the first bezel region B1. In addition, the portion of the anode layer 92 located in the first bezel region B1 and a portion of the anode layer 92 located in the display region A are arranged in a partitioned mode. In this way, the display effect of the display panel is guaranteed while the driving effect is considered.

In the embodiment of the present disclosure, in the second bezel region B2, the first blocking dam 201 includes a first sub-dam 2011 and a second sub-dam 2012 sequentially arranged at intervals, the first sub-dam 2011 is located between the second sub-dam 2012 and the second blocking dam 202, the first sub-dam 2011 includes the third flat layer 23, the pixel defining layer 30 and the spacer 40, the second sub-dam 2012 includes the third flat layer 23 and the pixel defining layer 30, and a thickness of the first sub-dam 2011 is greater than a thickness of the second sub-dam 2012.

Still in combination with the exemplary embodiment shown in FIG. 5, in the second bezel region B2, the first blocking dam 201 includes the first sub-dam 2011 and the second sub-dam 2012 sequentially arranged at intervals, and the first sub-dam 2011 and the second sub-dam 2012 further improve the blocking effect on thin film packaging materials. Moreover, the first sub-dam 2011 is located between the second sub-dam 2012 and the second blocking dam 202, the first sub-dam 2011 includes the third flat layer 23, the pixel defining layer 30 and the spacer 40, the second sub-dam 2012 includes the third flat layer 23 and the pixel defining layer 30, and in this way, the thickness of the first sub-dam 2011 may be set to be slightly greater than the thickness of the second sub-dam 2012.

In the embodiment of the present disclosure, in the second bezel region B2 and regions corresponding to the first sub-dam 2011 and the second sub-dam 2012, the high-potential trace 91 is located between the first sub-dam 2011 and the base substrate 10, as well as between the second sub-dam 2012 and the base substrate 10.

During specific implementation, still in combination with the exemplary embodiment shown in FIG. 5, in the second bezel region B2 and the regions corresponding to the first sub-dam 2011 and the second sub-dam 2012, the high-potential trace 91 is located between the first sub-dam 2011 and the base substrate 10, as well as between the second sub-dam 2012 and the base substrate 10, so that the flatness of the first sub-dam 2011 and the second sub-dam 2012 in a preparation process is guaranteed, and the preparation efficiency of the display panel is improved.

It should be noted that, in addition to the film layer structures mentioned above, the display panel further includes a thin film packaging layer arranged on sides of the blocking dams 20 facing away from the base substrate 10, and the thin film packaging layer is configured to package the display panel to block water oxygen erosion so as to avoid failure of a light emitting device caused by water oxygen erosion. Exemplarily, the thin film packaging layer may include a first inorganic packaging layer, an organic packaging layer and a second inorganic packaging layer facing away from the base substrate 10 in sequence, wherein a material of the first inorganic packaging layer may be at least one of silicon oxide, silicon nitride and silicon oxynitride, a material of the second inorganic packaging layer may be at least one of silicon oxide, silicon nitride and silicon oxynitride, and a material of the organic packaging layer may be an organic material suitable for ink-jet printing, which is not limited here. Of course, the thin film packaging layer may further include more film layers in which inorganic packaging layers and organic packaging layers are arranged alternately, which is not limited here. It should be noted that, regardless of the structure of the thin film packaging layer, the topmost layer of the thin film packaging layer is arranged as an inorganic packaging layer to effectively block water oxygen.

In addition, the display panel further includes a flexible multi-layer on cell (FMLOC) located on a side of the thin film packaging layer facing away from the base substrate 10. Correspondingly, various film layers of the flexible multi-layer on cell may be directly manufactured on the thin film packaging layer, so that the flexible multi-layer on cell is arranged in the film layer structures without arranging a touch control substrate additionally, thereby ensuring a touch control function of the display panel while ensuring the lightweight design of the display panel. Of course, the display panel in the embodiment of the present disclosure includes not only the film layer structures mentioned above, but also other film layer structures may be arranged according to actual application demands. A specific arrangement condition may refer to the technical implementation in relevant technologies, and will not be elaborated here.

Figure 8:
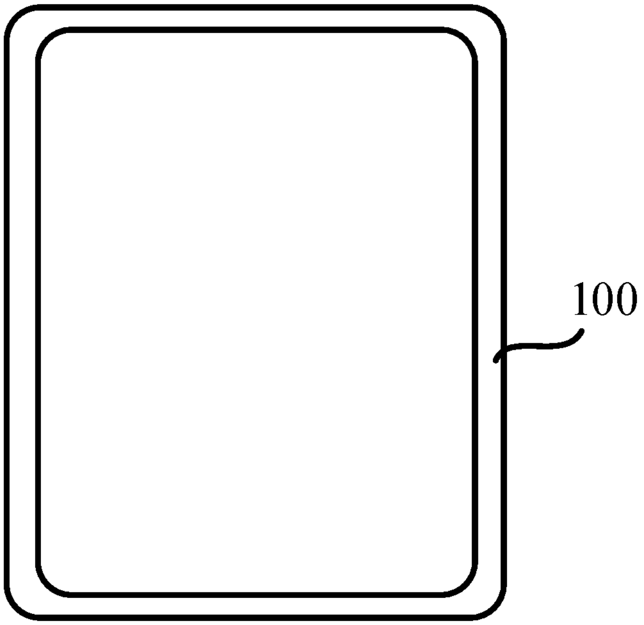
FIG. 8 is a schematic structural diagram of a display apparatus provided by an embodiment of the present disclosure.

Based on the same disclosure concept, as shown in FIG. 8, an embodiment of the present disclosure further provides a display apparatus, including:

the display panel 100 according to any one of the above.

During specific implementation, the principle for solving problems of the display apparatus is similar to that of the aforementioned display panel, and thus the implementation of the display apparatus can refer to the implementation of the aforementioned display panel, and repetitions are omitted here.

In addition, the display apparatus provided by the embodiment of the present disclosure may be a mobile phone, or any product or component with a display function such as a tablet computer, a television, a display, a laptop, a digital photo frame and a navigator. Other essential components of the display apparatus shall be understood by those of ordinary skill in the art, and are omitted herein and likewise shall not become a restriction to the present disclosure.

Although the preferred embodiments of the present disclosure have been described, those skilled in the art can make additional changes and modifications on these embodiments once they know the basic creative concept. So the appended claims are intended to be construed to include the preferred embodiments and all changes and modifications that fall into the scope of the present disclosure.

Apparently, those skilled in the art can make various modifications and variations to the present disclosure without departing from the spirit and scope of the present disclosure. In this way, if these modifications and variations of the present disclosure fall within the scope of the claims of the present disclosure and equivalent technologies thereof, the present disclosure is also intended to include these modifications and variations.

What is claimed is:

1. A display panel, comprising:

a base substrate, comprising a display region and a non-display region surrounding the display region, the non-display region comprising a first bezel region and a second bezel region having a binding region;

blocking dams located in the non-display region and arranged surrounding the display region, the blocking dams comprising a first blocking dam and a second blocking dam, and the first blocking dam being located between the second blocking dam and the display region; and a first flat layer, a second flat layer and a third flat layer located on the base substrate; wherein the second blocking dam comprises the first flat layer and the third flat layer in the first bezel region, and the second blocking dam comprises the second flat layer and the third flat layer in the second bezel region.

2. The display panel according to claim 1, wherein an overall thickness of the second blocking dam in the first bezel region and the second bezel region is approximately uniform.

3. The display panel according to claim 2, further comprising a pixel defining layer and a spacer, wherein the first flat layer, the second flat layer, the third flat layer, the pixel defining layer and the spacer are sequentially arranged facing away from the base substrate, the second blocking dam further comprises the pixel defining layer and the spacer in the first bezel region, and the second blocking dam further comprises the pixel defining layer in the second bezel region.

4. The display panel according to claim 1, further comprising a first source-drain layer located between the first flat layer and the base substrate, a second source-drain layer located between the first flat layer and the second flat layer, and a third source-drain layer located between the second flat layer and the third flat layer, wherein the first source-drain layer, the second source-drain layer and the third source-drain layer at least partially overlap the second blocking dam.

5. The display panel according to claim 4, wherein in the first bezel region, the display panel comprises a plurality of panel crack detection lines and a low-potential trace; wherein the low-potential trace comprises a first structure, a second structure and a third structure sequentially arranged facing away from the base substrate in a stacked mode, the first structure and the panel crack detection lines are arranged at the same layer as the first source-drain layer, the second structure is arranged at the same layer as the second source-drain layer, and the third structure is arranged at the same layer as the third source-drain layer.

6. The display panel according to claim 5, wherein an orthographic projection of at least one of the plurality of panel crack detection lines on the base substrate completely falls into a region range of an orthographic projection of the second blocking dam on the base substrate, and the at least one panel crack detection line is completely coated with the first flat layer; and in a region corresponding to the second blocking dam of the first bezel region, the first structure, the second structure and the third structure all partially overlap the first flat layer.

7. The display panel according to claim 4, wherein in the second bezel region, the display panel comprises a high-potential trace and a low-potential trace; wherein the high-potential trace comprises a fourth structure, a fifth structure and a sixth structure sequentially arranged facing away from the base substrate in a stacked mode, the sixth structure is arranged at the same layer as the third source-drain layer, the fifth structure is arranged at the same layer as the second source-drain layer, and the fourth structure is arranged at the same layer as the first source-drain layer.

8. The display panel according to claim 7, wherein the sixth structure completely penetrates through the second blocking dam, and in a region corresponding to the second blocking dam of the second bezel region, the fourth structure and the fifth structure partially overlap, and the second flat layer completely coats an overlapping part of the fourth structure and the fifth structure.

9. The display panel according to claim 1, wherein the second blocking dam further comprises an adapting portion extending from the first bezel region to the second bezel region, and surfaces of sides, facing away from the base substrate, of the first flat layer included in the adapting portion and the second flat layer included in the second blocking dam in the second bezel region are arranged in an approximately flush mode.

10. The display panel according to claim 5, wherein, in the first bezel region, the first blocking dam comprises the third flat layer, the pixel defining layer and the spacer, and in a region corresponding to the first blocking dam, the low-potential trace is located between the first blocking dam and the base substrate.

11. The display panel according to claim 10, further comprising an anode layer located between the pixel defining layer and the third flat layer, and in the first bezel region, the anode layer is electrically connected with the low-potential trace, and the low-potential trace is electrically connected with a cathode layer through a portion of the anode layer located in the first bezel region.

12. The display panel according to claim 7, wherein, in the second bezel region, the first blocking dam comprises a first sub-dam and a second sub-dam sequentially arranged at intervals, the first sub-dam is located between the second sub-dam and the second blocking dam, the first sub-dam comprises the third flat layer, the pixel defining layer and the spacer, the second sub-dam comprises the third flat layer and the pixel defining layer, and a thickness of the first sub-dam is greater than a thickness of the second sub-dam.

13. The display panel according to claim 12, wherein, in the second bezel region and regions corresponding to the first sub-dam and the second sub-dam, the high-potential trace is located between the first sub-dam and the base substrate, as well as between the second sub-dam and the base substrate.

14. A display apparatus, comprising:

a display panel, wherein the display panel comprises:

a base substrate, comprising a display region and a non-display region surrounding the display region, the non-display region comprising a first bezel region and a second bezel region having a binding region;

blocking dams located in the non-display region and arranged surrounding the display region, the blocking dams comprising a first blocking dam and a second blocking dam, and the first blocking dam being located between the second blocking dam and the display region; and a first flat layer, a second flat layer and a third flat layer located on the base substrate; wherein the second blocking dam comprises the first flat layer and the third flat layer in the first bezel region, and the second blocking dam comprises the second flat layer and the third flat layer in the second bezel region.

15. The display apparatus according to claim 14, wherein an overall thickness of the second blocking dam in the first bezel region and the second bezel region is approximately uniform.

16. The display apparatus according to claim 15, wherein the display panel further comprises a pixel defining layer and a spacer, wherein the first flat layer, the second flat layer, the third flat layer, the pixel defining layer and the spacer are sequentially arranged facing away from the base substrate, the second blocking dam further comprises the pixel defining layer and the spacer in the first bezel region, and the second blocking dam further comprises the pixel defining layer in the second bezel region.

17. The display apparatus according to claim 14, the display panel further comprises a first source-drain layer located between the first flat layer and the base substrate, a second source-drain layer located between the first flat layer and the second flat layer, and a third source-drain layer located between the second flat layer and the third flat layer, wherein the first source-drain layer, the second source-drain layer and the third source-drain layer at least partially overlap the second blocking dam.

18. The display apparatus according to claim 17, wherein in the first bezel region, the display panel comprises a plurality of panel crack detection lines and a low-potential trace; wherein the low-potential trace comprises a first structure, a second structure and a third structure sequentially arranged facing away from the base substrate in a stacked mode, the first structure and the panel crack detection lines are arranged at the same layer as the first source-drain layer, the second structure is arranged at the same layer as the second source-drain layer, and the third structure is arranged at the same layer as the third source-drain layer.

19. The display apparatus according to claim 18, wherein an orthographic projection of at least one of the plurality of panel crack detection lines on the base substrate completely falls into a region range of an orthographic projection of the second blocking dam on the base substrate, and the at least one panel crack detection line is completely coated with the first flat layer; and in a region corresponding to the second blocking dam of the first bezel region, the first structure, the second structure and the third structure all partially overlap the first flat layer.

20. The display apparatus according to claim 17, wherein in the second bezel region, the display panel comprises a high-potential trace and a low-potential trace; wherein the high-potential trace comprises a fourth structure, a fifth structure and a sixth structure sequentially arranged facing away from the base substrate in a stacked mode, the sixth structure is arranged at the same layer as the third source-drain layer, the fifth structure is arranged at the same layer as the second source-drain layer, and the fourth structure is arranged at the same layer as the first source-drain layer.

* * * * *